(12) United States Patent
Yoshino et al.

(10) Patent No.: US 7,345,105 B2
(45) Date of Patent: Mar. 18, 2008

(54) CONDUCTIVE ADHESIVE COMPOSITION

(75) Inventors: Masachika Yoshino, Tokyo (JP); Motoo Fukushima, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 456 days.

(21) Appl. No.: 10/737,748

(22) Filed: Dec. 18, 2003

(65) Prior Publication Data

US 2004/0127626 A1 Jul. 1, 2004

(30) Foreign Application Priority Data

Dec. 20, 2002 (JP) ............................. 2002-369889

(51) Int. Cl.
C08J 3/00 (2006.01)
C08K 3/08 (2006.01)
C08L 67/00 (2006.01)
C08L 79/00 (2006.01)
C08L 83/00 (2006.01)

(52) U.S. Cl. ..................... 524/440; 524/439; 524/588; 524/599; 524/600; 524/602; 524/612

(58) Field of Classification Search ............... 524/440, 524/439, 588, 599, 600, 602, 612
See application file for complete search history.

(56) References Cited

U.S. PATENT DOCUMENTS

| 4,319,920 A | * | 3/1982 | Ehrreich ...................... 75/370 |
| 4,435,214 A | * | 3/1984 | Ehrreich ...................... 252/514 |
| 4,520,422 A | * | 5/1985 | Borland ...................... 361/305 |
| 4,695,404 A | * | 9/1987 | Kwong ........................ 252/514 |
| 5,162,062 A | * | 11/1992 | Carroll et al. ................. 148/24 |
| 5,180,523 A | * | 1/1993 | Durand et al. ............... 252/512 |
| 5,250,229 A | * | 10/1993 | Hara et al. ............... 252/519.54 |
| 5,298,194 A | * | 3/1994 | Carter et al. ................. 252/512 |
| 5,346,651 A | * | 9/1994 | Oprosky et al. ............ 252/514 |
| 5,492,653 A | * | 2/1996 | Hochheimer et al. ....... 252/514 |
| 5,658,499 A | * | 8/1997 | Steinberg et al. ........... 252/514 |
| 2002/0022152 A1 | * | 2/2002 | Okinaka et al. ........ 428/694 R |
| 2004/0203268 A1 | * | 10/2004 | Nishizawa ................... 439/91 |

FOREIGN PATENT DOCUMENTS

| JP | 7-169325 A | 7/1995 |
| JP | 9-82133 A | 3/1997 |
| JP | 9-296158 A | 11/1997 |
| JP | 11-158501 | 6/1999 |
| JP | 2000-256008 A | 9/2000 |
| JP | 2001-107101 A | 3/2001 |
| JP | 2003-268402 A | 9/2003 |

OTHER PUBLICATIONS

Abstract and Machine Translation for JP 2003-268402 (p. 1-13) and JP 09-296158 (p. 1-4).*
Abstract for JP 06-235006.*
Machine Translations for JP 2001-107101 (p. 1-10); JP 11-158501 (p.1-4); JP 09-082133 (p. 1-5).*
Abstract for KR 2002-080822.*
Schaefer et al. Conductive Adhesives With Improved Thermomechanical Properties. IEEE. 1998, p. 278-281.*

* cited by examiner

*Primary Examiner*—Patrick Niland
(74) *Attorney, Agent, or Firm*—Birch, Stewart, Kolasch & Birch, LLP

(57) ABSTRACT

A conductive adhesive composition is obtained by mixing a binder resin with 30-98 wt % based on the adhesive composition of a silver powder as a conductive agent. The silver powder contains a silver powder consisting of flat primary particles and having a massive agglomerate structure and a tap density of 0.1-1.5 g/cm$^3$ in an amount of 30-98 wt % based on the adhesive composition. The conductive adhesive composition cures into a product having improved conductivity, adhesion, heat resistance, moisture resistance, ease of working and heat transfer.

8 Claims, 1 Drawing Sheet

CONDUCTIVE ADHESIVE COMPOSITION

This Nonprovisional application claims priority under 35 U.S.C. § 119(a) on Patent Application No(s). 2002-369889 filed in JAPAN on Dec. 20, 2002, the entire contents of which are hereby incorporated by reference.

BACKGROUND OF THE INVENTION

Field of the Invention

This invention relates to a conductive adhesive composition, and more particularly, to a conductive adhesive composition for use in the assembly or mounting of electronic components. As used herein, the term "conductive" or "conduction" refers to electroconductive or electric conduction.

The semiconductor device assembly process involves the step of bonding a semiconductor chip to a metal frame, known as die bonding step. The semiconductor chip-lead frame bonding technology started with gold-silicon eutectic bonding and made transition to solders and then to conductive resin adhesives. At present, conductive resin adhesives are often employed in the assembly of ICs and LSIs while solder is employed in the assembly of discrete components like transistors and diodes. Particularly in conjunction with semiconductor devices such as ICs and LSIs, conductive resin adhesives causing less stresses than solders are on predominant use because such semiconductor chips have large areas. On the other hand, with respect to the discrete components like transistors and diodes for which solder is mainly employed, the recent concerns about the environmental problem encourage semiconductor manufacturers to make efforts to eliminate the use of lead normally contained in solders. Attempts have been made to use conductive resin adhesives in the discrete components too.

Typical conductive resin adhesives which have been used heretofore are based on epoxy resins in which silver flakes are dispersed to impart conductivity. The silver flakes used in conductive resin adhesives are prepared by collapsing ordinary granular silver particles. In the process, a lubricant, typically in the form of higher fatty acid, is used for preventing working strain or degradation of particle surface by oxidation and for preventing formation of abnormally large or coarse primary particles. However, since the lubricant used in the collapsing process strongly bonds to the surface of silver, it is left on the surface of silver flakes, exacerbating conductivity.

Although it is desirable that the silver powder be reduced in particle size in order to enable finer wiring, finer silver powder is more likely to agglomerate. The agglomeration tendency adversely affects the dispersion of particles in a binder resin, and results in variations of the thickness of a coating and variations of the electric resistance of conductive resin adhesive itself. Several countermeasures are thus taken to improve dispersion, for example, silver powder is previously ground, classified or otherwise processed prior to dispersion, or treated with a lubricant for preventing agglomeration. Alternatively, dispersion is conducted under increased shear forces for disintegration.

However, reduced yields and increased expense associated with such supplemental processing result in increased costs. Even when silver particles are dispersed through such processing, some agglomerated particles which have not been completely dispersed still remain in a non-uniform uncontrolled state. They often give rise to problems including variations of conductivity within a coating and surface irregularities that prevent printing of a thin electrode layer thereon. It is difficult to improve the dispersion in a reproducible manner and especially, to find a compromise between a low electric resistance and surface smoothness for fine-circuitry fabrication. Also the supplemental processing fails to achieve drastic improvement in quality.

In particular, the lubricant, despite its substantial effect of improving the dispersion of a silver powder treated therewith, has a negative impact on the conductivity and curability of an adhesive composition having the treated silver powder incorporated therein. If the conductive adhesive composition having the treated silver powder incorporated therein is stored for a long period of time, the composition loses curability with the passage of time and eventually incurs undercure. In this way, the attempt to increase the conductivity and reduce the size of silver powder results in deterioration of the conductivity of an adhesive composition due to insufficient dispersion during blending thereof. It is very difficult for the composition to develop a low electric resistance in a stable manner.

Reference is made to Japanese Patent Application No. 2002-073990, JP-A 2001-107101, JP-A 9-082133 and JP-A 11-158501.

SUMMARY OF THE INVENTION

An object of the invention is to provide a conductive adhesive composition capable of forming or bonding low-resistance electrodes, circuits and dies while ensuring ease of working and high reliability.

Testing a series of conductive adhesive compositions prepared by blending various metal powders with a binder resin, the inventor has found that a silver powder consisting of silver particles with a narrow size distribution and having a massive agglomerate structure as demonstrated by a tap density as low as 1.5 g/cm$^3$ or less can be prepared by starting with flat silver particles bearing a lubricant on their surfaces, mixing a solvent having the flat silver particles dispersed therein with a solvent containing a basic compound, and washing the mixture for removing the lubricant from the silver particles. A conductive adhesive composition using a substantial quantity of the agglomerate structure silver powder remains highly dispersible and develops a consistent electric conductivity without incurring conductivity deterioration due to poor dispersion of silver powder, because the agglomerate structure silver powder is readily disintegrated into primary particles.

According to one aspect, the present invention provides a conductive adhesive composition comprising a binder resin and 30 to 98% by weight based on the adhesive composition of a silver powder as a conductive agent. The silver powder comprises a silver powder consisting of flat primary particles and having a massive agglomerate structure and a tap density of up to 1.5 g/cm$^3$ in an amount of at least 30% by weight based on the adhesive composition.

BRIEF DESCRIPTION OF THE DRAWING

The only FIGURE.

DESCRIPTION OF THE PREFERRED EMBODIMENTS

Figure 1:
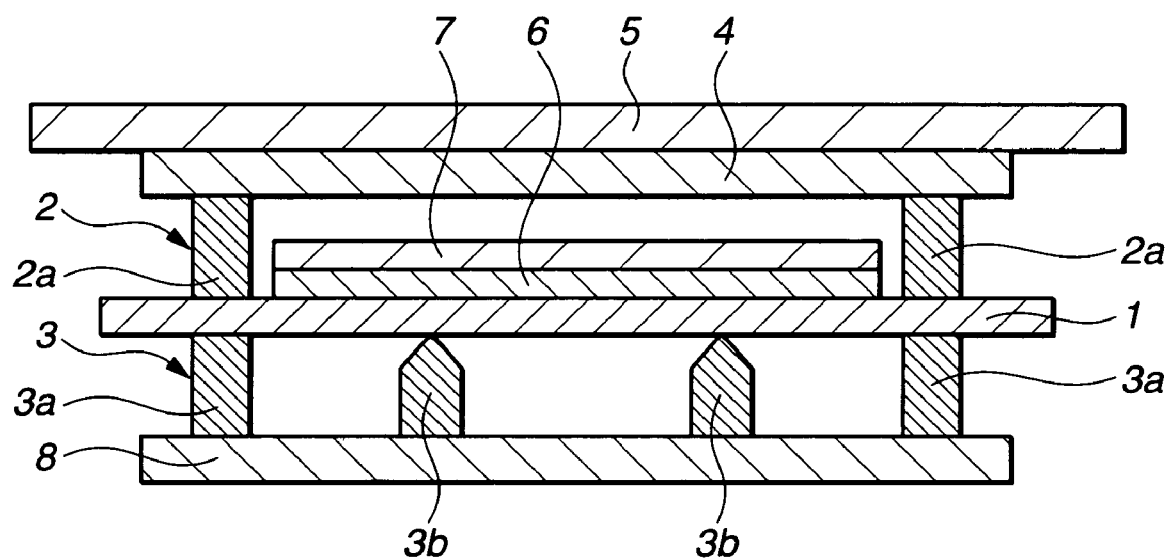
FIG. 1 is a schematic view illustrating how to measure the volume resistivity of a sample in Example.

The conductive powder used in the conductive adhesive composition of the invention is a silver powder. The silver powder used includes a silver powder consisting of flat primary particles and having a massive agglomerate structure and a tap density of up to 1.5 g/cm³. The total content of the silver powder in the conductive adhesive composition is 30 to 98% by weight. The content of the silver powder consisting of flat primary particles and having a massive agglomerate structure and a tap density of up to 1.5 g/cm³ is at least 30% by weight of the conductive adhesive composition.

As used herein, the "tap density" is a kind of bulk density and often used in the same meaning as bulk specific gravity. The bulk density is measured by filling a receptacle with a powder and dividing the weight by the volume, with its value being expressed in g/cm³. A loose bulk density is obtained when the receptacle is roughly filled with the powder without vibration. A tapped bulk density is obtained when the receptacle is filled with the powder as closely as possible by applying vibration. The latter is commonly designated tap density.

The silver powder used herein is made of pure silver or a silver alloy. Typical silver alloys are silver-copper alloys and silver-palladium alloys containing at least 50% by weight, especially at least 70% by weight of silver. Also useful are silver alloys containing such a metal as zinc, tin, magnesium and nickel. The silver powder is obtained in several ways, for example, by reducing an aqueous silver salt solution with a reducing agent (reduced silver powder), precipitating on a cathode through electrolysis (electrolytic silver powder), or atomizing molten metal into water or an inert gas (atomized silver powder). More particularly, the reduced silver powder is prepared in granular form by reducing an aqueous solution of silver nitrate with a reducing agent such as hydrazine, formaldehyde or ascorbic acid. The electrolytic silver powder is obtained as dendritic precipitates on the cathode through electrolysis of an aqueous silver nitrate solution. The atomized silver powder is prepared by heating silver at or above 1,000° C. and atomizing the molten silver into water or an inert gas.

The silver powder used herein preferably consists of primary particles having an average particle size between 0.01 µm and 10 µm, more preferably an average particle size between 0.1 µm and 5 µm. A silver powder with an average particle size of less than 0.01 µm is likely to form oxide on surfaces, which can exacerbate the conductivity of a conductive adhesive composition prepared therefrom. A silver powder with an average particle size of more than 10 µm may adversely affect the printability and surface smoothness of a conductive adhesive composition prepared therefrom. It is noted that the average particle size of a conductive silver powder is determined by ordinary particle size distribution measuring methods like laser diffraction and sedimentation methods.

In the practice of the invention, flat silver particles are used in order to increase the number of contact points between particles for better conduction. By the term "flat" is meant a thin-piece, scale or flake shape which is obtained by collapsing three-dimensional particles such as spherical or massive particles in one direction. The flat particles are defined in terms of a flatness or aspect ratio.

Provided that a flat particle has a length, a breadth and a thickness, the aspect ratio is defined as the maximum of length/breadth ratios, that is, maximum length/minimum breadth. The maximum length and minimum breadth from which the aspect ratio is calculated may be obtained by observing about 50 to 100 particles under SEM, and actually measuring the size on the image or analyzing the image by means of a commercial image analyzer. In the invention, powder particles desirably have an aspect ratio of at least 2/1, more preferably at least 3/1, especially at least 5/1. With an aspect ratio of less than 2/1, the development of conductivity by virtue of the contact between particles may be insufficient. Although the upper limit is not critical, the aspect ratio is usually up to about 500/1, especially up to about 100/1.

The silver powder of flat particles used herein can be prepared by adding a lubricant to the starting silver powder, mixing them, and applying mechanical energy to the mixture on a compression means such as a mechanical alloying apparatus, dry ball mill or roll mill or a means of blasting the powder against a rigid wall at a high velocity. When particles are deformed and flattened in a vessel such as a dry ball mill, the vessel is preferably kept in vacuum or filled with a non-oxidizing atmosphere such as argon gas or nitrogen gas because this prevents oxidation on particle surfaces.

Examples of the lubricant used herein include saturated or unsaturated higher fatty acids such as lauric acid, myristic acid, palmitic acid, stearic acid, oleic acid, arachidic acid and behenic acid; metallic soaps such as aluminum laurate, aluminum stearate, zinc laurate, and zinc stearate; higher aliphatic alcohols such as stearyl alcohol; esters of higher aliphatic alcohols; higher aliphatic amines such as stearyl amine; and higher aliphatic amides and polyethylene wax, alone or in admixture of two or more, as well as various waxes. Any appropriate lubricant may be selected from these depending on a particular grinding apparatus and grinding conditions, a particular flattening apparatus and flattening conditions. The amount of the lubricant used is 0.1 to 5.0 parts by weight, especially 0.5 to 2.0 parts by weight per 100 parts by weight of the starting silver powder.

Subsequently, the lubricant is removed from the thus flattened silver particles by the procedure to be described below. A solvent having the flat silver particles dispersed therein is mixed with a solvent containing a basic compound, after which the solvent is separated as by filtration. The lubricant is thus removed and at the same time, the flat silver particles are agglomerated. A choice of these conditions results in a silver powder of massive agglomerate structure featuring a low tap density, ease of disintegration into primary particles, a high dispersibility and ease of formulation to an adhesive composition.

Examples of the basic compound include hydroxides, and alkoxides (e.g., methoxides, ethoxides, propoxides, butoxides) of alkali metals such as sodium and potassium, and alkaline earth metals such as magnesium and calcium. Of these, sodium methoxide is most preferred.

The solvent used herein is selected from those solvents in which the lubricant is dissolvable, alone or in admixture. Examples include mineral spirits, aliphatic hydrocarbons such as hexane, heptane, cyclohexane and octane, aromatic hydrocarbons such as benzene, toluene and xylene, halogenated hydrocarbons such as chlorobenzene, trichlorobenzene, perchloroethylene and trichloroethylene, alcohols such as methanol, ethanol, n-propyl alcohol, and n-butanol, ketones such as acetone, n-propanone, and 2-butanone, esters such as ethyl acetate and propyl acetate, and ethers such as tetrahydrofuran, diethyl ether and ethyl propyl ether. Water may be used in combination with a surfactant because silver powder is less dispersible in water alone. The desired solvent is selected from alcohol and ketone solvents which have polarity and are effective for washing the lubricant away from the silver particles to which it has been attached. The solvent in which the flat silver particles are dispersed may be identical with or different from the solvent containing a basic compound.

The amount of the basic compound added is preferably 0.1 to 20 parts by weight, more preferably 0.2 to 10 parts by weight per 100 parts by weight of the silver powder. Less than 0.1 pbw of the basic compound may lead to such problems as a prolonged time required for separation of the lubricant from the silver powder, insufficient cleaning of the lubricant, an increased tap density, and less dispersibility. If more than 20 pbw of the basic compound is used, the cleaning or removal of the alkali or alkaline earth metal originating from the basic compound may become insufficient and the cost may increase.

A specific procedure for lubricant removal is described. A first solution of the flat silver powder in a solvent and a second solution of the basic compound in a solvent are separately prepared. The first and second solutions are agitated and mixed at a temperature of 10 to 60° C., preferably 10 to 30° C. The amount of the flat silver powder dispersed in the solvent is preferably 5 to 80% by weight, especially 10 to 60% by weight. The concentration of the basic compound in the solvent is preferably 0.1 to 10% by weight, especially 0.5 to 3.0% by weight.

In the event of batchwise mixing, the silver powder is contained in a reaction vessel, to which a solvent is added and agitated therewith to form a silver powder dispersion, to which a solution of the basic compound is added and agitated therewith. The time of addition is a brief time, preferably within 100 seconds, more preferably several seconds to several tens of seconds. The mixing is completed within such a brief time for the following reason. If mixing is continued for a relatively long time, agglomeration reaction is partially completed before both the solutions are thoroughly mixed and diffused with each other so that the reaction system eventually reaches a predetermined uniform concentration, whereby silver particles produced in the batch become non-uniform. As a result, the silver particles produced become poor in particle size distribution, and particle shape and physical properties of agglomerated particles. In the continuous system, the basic compound solution is preferably added to a continuous flow of the silver powder-dispersed solvent to effect instantaneous mixing.

After batchwise or continuous mixing is done in this way, the mixture is agitated to initiate agglomeration reaction whereupon agglomerated silver particles precipitate. Once the solvent having flat silver powder dispersed therein and the solvent containing a basic compound are mixed, agglomeration reaction starts. Even after the mixing of the entire volumes of both the solutions, agitation is continued until agglomeration ceases. In this regard, the reaction time is preferably about 0.1 to 10 hours, especially about 0.5 to 2 hours. From the liquid mixture in which the reaction has completed, agglomerated silver particles are separated by an ordinary solid-liquid separation technique such as gravity sedimentation or suction filtration. Further, any residual components of the reaction solution deposited on particle surfaces are removed as by washing, followed by thorough drying in a dryer or the like.

The thus obtained silver powder of agglomerate structure containing internal voids and having a low bulk specific gravity should have a tap density of up to 1.5 g/cm$^3$, preferably 0.1 to 1.3 g/cm$^3$, especially 0.3 to 1.2 g/cm$^3$, and preferably take a massive shape having an average particle size from more than 10 μm to 1,000 μm, especially from 15 to 800 μm. With a tap density of more than 1.5 g/cm$^3$, the agglomerated silver particles are resistant to disintegration and thus less dispersible.

The agglomerated state of the massive agglomerate structure silver powder is not robust so that upon application of a slight pressure from the exterior, the agglomerated particles are disintegrated into primary particles in a dispersed state. Then, when the silver powder is dispersed in a conductive adhesive composition, the massive agglomerate structure allows mixing to be done without scattering fine primary particles to the surrounding. Due to the agglomerate structure having a low bulk specific gravity as demonstrated by a tap density of up to 1.5 g/cm$^3$, the agglomerated particles are readily disintegrated into primary particles by moderate shear forces exerted by a conventional mixing means such as a roll mill or kneader. The primary particles thus disintegrated can be uniformly mixed with the binder resin.

The content of a silver powder in the conductive adhesive composition of the invention is 30 to 98% by weight, preferably 50 to 95% by weight, more preferably 60 to 93% by weight. Of the entire silver powder, the silver powder consisting of flat primary particles and having a massive agglomerate structure and a tap density of up to 1.5 g/cm$^3$ is contained in an amount of at least 30% by weight (i.e., 30 to 98% by weight), usually 35 to 98% by weight, preferably 40 to 95% by weight, more preferably 50 to 93% by weight based on the adhesive composition. If the total silver powder content is less than 30% by weight of the conductive adhesive composition, the composition becomes less conductive. If the total silver powder content is more than 98% by weight, the composition is fully conductive, but exhibits substantial losses of physical properties and poor adhesion. If the content of the massive agglomerate structure silver powder is less than 30% by weight of the conductive adhesive composition, high loading is difficult, failing to achieve a low electric resistance.

The binder resin used herein is not critical although it is preferably a thermosetting resin. Suitable thermosetting resins include epoxy resins, acrylate resins, cyanate resins, polyamic acid, polyimide resins, bismaleimide resins, phenolic resins, silicone resins and modified resins thereof. These resins may be used alone or in admixture of two or more. For those thermosetting resins which need curing agents, any suitable curing agent that matches with the desired properties may be selected. Other additives may be blended, if desired, while they are properly selected in accordance with the desired properties. For semiconductor devices which are desired to be resistant to moisture, heat and thermal shocks, most preferred are epoxy resins, polyimide resins, silicone resins and modified resins thereof.

In one application wherein the conductive adhesive composition of the invention is used as a resin paste, the binder resin is preferably liquid at room temperature. However, a solid resin diluted with a solvent is acceptable as long as no expansion occurs upon bonding. For the resin paste, the binder resin is generally combined with the silver powder and optional additives such as a curing agent, curing accelerator, filler (e.g., silica), and adhesion promoter (e.g., carbon functional silane). The resin paste is prepared, for example, by premixing the components on a double-rotation mixer and kneading on a three-roll mill.

In another application wherein the conductive adhesive composition of the invention is used as a sheet, as in the case of paste, the binder resin which is melted or dissolved in a solvent is premixed with the silver powder and optional additives such as a curing agent, curing accelerator, filler (e.g., silica), and adhesion promoter (e.g., carbon functional silane) on a double-rotation mixer, followed by kneading on a three-roll mill to form a paste. Using a roll coater or the like, the paste is then extended on a laminate film to form a sheet. Thereafter, the solvent is evaporated to dryness or the sheet is B-staged (or semi-cured), obtaining a sheet-shaped adhesive.

When a semiconductor device is manufactured using the conductive adhesive composition of the invention, the manufacturing process involves the step of bonding a semiconductor chip to a lead frame with a gold wire, known as wire bonding step. The wire bonding step includes heating at a temperature of 150 to 250° C. If a thermoplastic resin is used, it would soften at that temperature, allowing the semiconductor chip to become separated. For this reason, a thermosetting resin must be used. Any of curing modes including heat, radiation and moisture curing may be selected depending on cure temperature conditions and the desired application.

The conductive adhesive composition of the invention is best suited as a die bonding agent used in the step of bonding a semiconductor chip to a metal lead frame in the semiconductor device assembly, known as die bonding step. The composition is also used to form conductors on various substrates and films (serving as insulating material) by coating, printing or potting and to form conductors in through-holes, electrodes, jumper wires, EMI shields or the like. The composition is also used as a conductive adhesive for bonding electronic components such as resistors, chip resistors, and chip capacitors to insulating substrates and as lead-free solder replacement.

The substrates described just above include polyimide resin substrates, paper/phenolic resin substrates, glass-reinforced epoxy substrates, enamel substrates, and ceramic substrates. The films include flexible films of resins such as polyethylene, polycarbonate, polyvinyl chloride, polystyrene, polyethylene terephthalate, polyphenylene sulfide, polyether ketone, polyether imide and polyimide. The insulating substrates used herein may have parts of conductor or resistor pre-formed on their surface or in through-holes by plating, printing, evaporation or etching.

There has been described a conductive adhesive composition which cures into a product having not only improved conductivity, but also improved adhesion, heat resistance, moisture resistance, ease of working and heat transfer.

EXAMPLE

Examples of the invention are given below by way of illustration and not by way of limitation. The viscosity is a measurement at 23° C.

Preparation Example 1

Preparation of Flat Silver Powder A

An aqueous solution of silver complex was prepared by adding 700 ml of deionized water to 340 g of silver nitrate (guaranteed reagent), and then adding 700 ml of 25% aqueous ammonia. Separately, a reducing aqueous solution was prepared by blending 111 g of hydroquinone (guaranteed reagent), 159 g of anhydrous potassium sulfite (guaranteed reagent) and 12.6 liters of deionized water.

The reducing aqueous solution was contained in a beaker and vigorously agitated while the silver complex aqueous solution was added thereto. During the reaction, the solution mixture was kept at a constant temperature of 25° C. After the termination of addition, the mixture was agitated for a sufficient time to complete reductive precipitation. The silver powder precipitated was separated by filtration, washed with water and dried.

To 988 g of the silver powder was added 12 g of stearic acid. A ball mill charged with zirconia balls with a diameter of 2 mm was rotated for 30 minutes to mill the particles for flattening, yielding a flat silver powder A having an average particle size of 10 μm and an aspect ratio of 5. The flat silver powder A contained a small fraction of uneven agglomeration and had a tap density of 2.8 g/cm$^3$.

Preparation Example 2

Preparation of Agglomerated Silver Powder B

A 0.5-liter rotary tank was charged with 100 g of flat silver powder A and 150 g of isopropyl alcohol and rotated for one hour for dispersing the powder in the alcohol. A solution obtained by adding 10 g of isopropyl alcohol to 1.5 g of a 28% methanol solution of sodium methoxide as a basic compound was promptly added to the dispersion, which was vigorously mixed. Then liberation of the lubricant from the silver particle surface and agglomeration of particles took place simultaneously. After about 30 seconds, the entire liquid mixture agglomerated and solidified. Thereafter, the rotary tank was rotated for 30 minutes for agitation to drive the reaction to completion.

The agglomerated silver powder was separated from the solvent by filtration, fully washed with acetone for removing the sodium methoxide and the lubricant, and then dried at 55° C. in a vacuum of 5 mmHg. The agglomerated silver powder designated B had a tap density of 0.74 g/cm$^3$. A microscopic observation showed uniform agglomeration to form massive particles having an approximately equal size. The agglomerated silver powder B had an average particle size of 40 μm.

Preparation Example 3

Preparation of Agglomerated Silver Powder C

A 0.5-liter rotary tank was charged with 100 g of flat silver powder A and 150 g of isopropyl alcohol and rotated for one hour for dispersing the powder in the alcohol. A solution obtained by adding 10 g of isopropyl alcohol to 1.5 g of a 10% methanol solution of sodium methoxide as a basic compound was promptly added to the dispersion, which was vigorously mixed. Then liberation of the lubricant from the silver particle surface and agglomeration of particles took place simultaneously. After about 30 seconds, the entire liquid mixture agglomerated and solidified. Thereafter, the rotary tank was rotated for 30 minutes for agitation to drive the reaction to completion.

The agglomerated silver powder was separated from the solvent by filtration, fully washed with acetone for removing the sodium methoxide and the lubricant, and then dried at 55° C. in a vacuum of 5 mmHg. The agglomerated silver powder designated C had a tap density of 0.95 g/cm$^3$. A microscopic observation showed uniform agglomeration to form massive particles having an approximately equal size. The agglomerated silver powder C had an average particle size of 60 μm.

The reactants used in the following synthesis examples are designated by abbreviations.
BPDA: 3,3',4,4'-biphenyltetracarboxylic acid dianhydride
BTDA: 3,3',4,4'-benzophenonetetracarboxylic acid dianhydride
DPE: 4,4'-diaminodiphenyl ether
BAPP: 2,2-bis(4-(4-aminophenoxy)phenyl)propane
APM: 1,3-bis(3-aminopropyl)-1,1,3,3-tetramethyldisiloxane

Synthesis Example 1

Synthesis of Binder Resin

A flask equipped with a stirrer, thermometer and nitrogen purge line was charged with 9.66 g (0.03 mol) of BTDA as a tetracarboxylic acid dianhydride component and 30 g of N-methyl-2-pyrrolidone. To this solution, 17.0 g of an N-methyl-2-pyrrolidone solution containing 6.00 g (0.03 mol) of DPE as a diamine component was added dropwise at such a controlled rate that the temperature of the reaction system might not exceed 50° C. After the completion of dropwise addition, agitation was continued for 12 hours at room temperature for promoting the reaction, yielding a yellowish brown clear solution of polyamic acid. This solution, designated Polyamic Acid Solution 1, had a viscosity of 50 Pa·s and a resin solids content of 50%.

Synthesis Example 2

Synthesis of Binder Resin

A reactor as used in Synthesis Example 1 was charged with 29.42 g (0.10 mol) of BPDA, 7.46 g (0.03 mol) of APM, 28.73 g (0.07 mol) of BAPP, and 196.8 g of cyclohexanene. Reaction was effected for 12 hours at room temperature, yielding a polyamic acid solution. To the polyamic acid solution was added 30 g of toluene. A Dimroth condenser having a Dean-Stark trap was attached to the reactor whereupon reaction was effected for 8 hours at 180° C., synthesizing a polyimide resin solution. This solution, designated Polyimide Solution 1, had a viscosity of 66 Pa·s and a resin solids content of 25.3%.

Example 1

A conductive paste was prepared by uniformly mixing 100 parts by weight of Polyamic Acid Solution 1 (50 parts by weight of polyamic acid resin solids) with 200 parts by weight of agglomerated silver powder B. The paste was cured at 150° C. for one hour and further at 250° C. for 4 hours.

Example 2

A conductive paste was prepared by uniformly mixing 100 parts by weight of Polyamic Acid Solution 1 (50 parts by weight of polyamic acid resin solids) with 200 parts by weight of agglomerated silver powder C. The paste was cured at 150° C. for one hour and further at 250° C. for 4 hours.

Example 3

A conductive adhesive sheet was prepared by uniformly mixing 100 parts by weight of Polyimide Solution 1 (25.3 parts by weight of polyimide resin solids) with 100 parts by weight of agglomerated silver powder B, coating the mixture on a Teflon® film, and curing at 80° C. for one hour. The sheet was further cured at 250° C. for 4 hours.

Example 4

A conductive paste was prepared by uniformly mixing 52.3 parts by weight of a liquid epoxy resin RE-310 (Nippon Kayaku Co., Ltd.), 47.7 parts by weight of an acid anhydride epoxy-curing agent MH-700 (New Japan Chemical Co., Ltd.), 300 parts by weight of agglomerated silver powder B, and 1.0 part by weight of an imidazole curing catalyst 2PZ (Shikoku Corp.). The paste was cured at 180° C. for 4 hours.

Example 5

A conductive paste was prepared by uniformly mixing 100 parts by weight of a both end dimethylvinylsiloxy-capped dimethylpolysiloxane having a viscosity of 2,000 centipoises (vinyl content=0.2% by weight), 300 parts by weight of agglomerated silver powder B, 1.0 part by weight of a both end trimethylsiloxy-capped methylhydrogenpolysiloxane having a viscosity of 30 centipoises (silicon atom-bonded hydrogen atom content=1.5% by weight), 1.0 part by weight of an epoxy group-containing siloxane (1 mol of allyl glycidyl ether partially added to 1 mol of 1,3,5,7-tetramethylcyclotetrasiloxane), 0.05 part by weight of an octyl alcohol-modified solution of chloroplatinic acid (platinum content 2 wt %), and 0.01 part by weight of ethynyl cyclohexyl alcohol. The paste was cured at 150° C. for 4 hours.

Comparative Example 1

A conductive paste was prepared by uniformly mixing 100 parts by weight of Polyamic Acid Solution 1 (25.1 parts by weight of polyamic acid resin solids) with 100 parts by weight of flat silver powder A. The paste was cured at 150° C. for one hour and further at 250° C. for 4 hours.

Each of the six conductive adhesives prepared above was cured under predetermined conditions to form a sheet of 0.1 mm thick, the volume resistivity of which was measured as follows.

<Measurement of Volume Resistivity>

As shown in FIG. 1, a specimen 1 of 150 mm long, 20 mm wide and 0.1 mm thick is sandwiched between upper and lower electrodes 2 and 3. The upper electrode 2 includes a pair of current terminals 2a, 2a of 30 mm long, 15 mm wide and 5 mm thick attached to an insulating plate 4 of polyethylene. A weight 5 is rested on the insulating plate 4 so that a weight of 5 kg is applied to the current terminals 2a, 2a. The lower electrode 3 includes a pair of current terminals 3a, 3a of 30 mm long, 15 mm wide and 5 mm thick and a pair of knife-shaped voltage terminals of 30 mm long and 5 mm wide. The current terminals 3a, 3a of the lower electrode 3 are opposed to the current terminals 2a, 2a of the upper electrode 2, respectively. A weight 7 of 0.5 kg is rested on the specimen 1 via an insulating plate 6. The lower electrode 3 is situated on an insulating plate 8. In this state, the upper and lower electrodes 2 and 3 are connected to an ohm meter for measuring a volume resistivity.

<Reliability Against Moisture>

A silicon chip dimensioned 10.0×8.0×0.3 mm was pressure bonded to a 64PIN-QFP frame (nickel-plated copper) with a conductive adhesive by means of a die bonding machine under conditions of 200° C., 5 seconds and 5 kg. Curing and bonding was achieved under the curing temperature and time conditions shown in Table 1.

Using a transfer molding machine, an epoxy molding compound KMC-110 (Shin-Etsu Chemical Co., Ltd.) was molded over the chip at 180° C. for 2 minutes to form a quad flat package (QFP) and post-cured at 180° C. for 4 hours. The package was allowed to stand in a constant temperature/constant humidity chamber of 85° C. and 85% RH for 72 hours and then passed through an IR reflow furnace at 260° C. for 10 seconds. The number of resin cracked samples per twenty samples was counted.

TABLE 1

|  | Example 1 | Example 2 | Example 3 | Example 4 | Example 5 | Comparative Example 1 |
|---|---|---|---|---|---|---|
| Binder resin | Polyamic Acid Solution 1 | Polyamic Acid Solution 1 | Polyimide Solution 1 | Liquid epoxy resin | Silicone resin | Polyamic Acid Solution 1 |
| Silver powder | Agglomerated silver powder B | Agglomerated silver powder C | Agglomerated silver powder B | Agglomerated silver powder B | Agglomerated silver powder B | Flat silver powder A |
| State | paste | paste | sheet | paste | paste | paste |
| Curing conditions | 150° C./1 h + 250° C./4 h | 150° C./1 h + 250° C./4 h | 250° C./4 h | 180° C./4 h | 150° C./4 h | 150° C./1 h + 250° C./4 h |
| Volume resistivity ($\Omega$m) | $7 \times 10^{-7}$ | $9 \times 10^{-6}$ | $2 \times 10^{-7}$ | $5 \times 10^{-7}$ | $4 \times 10^{-6}$ | $8 \times 10^{-2}$ |
| Reliability against moisture (cracked samples) | 0 | 0 | 0 | 0 | 0 | 3 |

Japanese Patent Application No. 2002-369889 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A conductive adhesive composition comprising:
   a binder resin; and
   30 to 98% by weight based on the adhesive composition of a silver powder as a conductive agent,
   wherein said silver powder comprises a silver powder consisting of flat primary particles having an aspect ratio of at least 3/1 and has a massive agglomerate structure,
   a tap density of the massive agglomerate structure being up to 1.5 g/cm$^3$, and
   the silver powder having the agglomerate structure has an average particle size from 15 µm to 1,000 µm.

2. The conductive adhesive composition of claim 1, wherein said binder resin is a thermosetting resin.

3. The conductive adhesive composition of claim 2, wherein said binder resin is a thermosetting resin selected from the group consisting of an epoxy resin, polyamic acid, polyimide resin and silicone resin.

4. A conductive adhesive composition comprising:
   a binder resin; and
   30 to 98% by weight based on the adhesive composition of a silver powder as a conductive agent,
   wherein said silver powder comprises a silver powder consisting of flat primary particles having an aspect ratio of at least 3/1 and has a massive agglomerate structure, a tap density of the massive agglomerate structure being up to 1.5 g/cm$^3$, and the silver powder of agglomerate structure has an average particle size from 15 µm to 1,000 µm, and
   said silver powder having the massive agglomerate structure having been prepared by mixing a solvent, in which flat silver particles the surface of which has been treated with a lubricant are dispersed, with a solvent containing a basic compound, and removing the lubricant from the mixture.

5. The conductive adhesive composition of claim 4, wherein said binder resin is a thermosetting resin.

6. The conductive adhesive composition of claim 5, wherein said binder resin is a thermosetting resin selected from the group consisting of an epoxy resin, polyamic acid, polyimide resin and silicone resin.

7. The conductive adhesive composition of claim 1, wherein the silver powder having the agglomerate structure has an average particle size from 40 µm to 1,000 µm.

8. The conductive adhesive composition of claim 4, wherein the silver powder having the agglomerate structure has an average particle size from 40 µm to 1,000 µm.

* * * * *